United States Patent [19]
Kojima et al.

[11] Patent Number: 5,841,157
[45] Date of Patent: Nov. 24, 1998

[54] SEMICONDUCTOR INTEGRATED CIRCUIT INCLUDING A HIGH DENSITY CELL

[75] Inventors: Hirofumi Kojima; Yutaka Kamakura, both of Hyogo, Japan

[73] Assignees: Mitsubishi Electric Semiconductor Software Co., Ltd., Hyogo; Mitsubishi Denji Kabushiki Kaisha, Tokyo, both of Japan

[21] Appl. No.: 772,050

[22] Filed: Dec. 19, 1996

[30] Foreign Application Priority Data

Jul. 23, 1996 [JP] Japan .................................. 8-193392

[51] Int. Cl.⁶ .................................................. H01L 27/10
[52] U.S. Cl. ........................... 257/202; 257/204; 257/210
[58] Field of Search ..................... 257/202–211

[56] References Cited

U.S. PATENT DOCUMENTS

| | | | |
|---|---|---|---|
| 5,060,046 | 10/1991 | Shintani | 257/206 |
| 5,309,015 | 5/1994 | Kuwata et al. | 257/207 |
| 5,311,048 | 5/1994 | Takahashi et al. | 257/207 |
| 5,313,079 | 5/1994 | Brasen et al. | 257/206 |
| 5,586,319 | 12/1996 | Bell | 395/701 |
| 5,666,288 | 9/1997 | Jones et al. | 364/490 |
| 5,698,873 | 12/1997 | Colwell et al. | 257/206 |

*Primary Examiner*—David B. Hardy
*Attorney, Agent, or Firm*—Leydig, Voit & Mayer

[57] ABSTRACT

A semiconductor integrated circuit device includes a high density cell in which a more densely integrated layout is provided by combining cells having the same circuit configuration and sharing a basic gate portion among each of the cells.

4 Claims, 14 Drawing Sheets

FIG. 6

```
module CIRCUIT (DATA, CLK, RESET, Q)
  output    Q;
  input     DATA, CLK, RESET;

FF   I1 (.D(DATA), .Q(net2), .T(CLK), .R(RESET));
  FF   I2 (.D(net1), .Q(net4), .T(CLK), .R(RESET));
  FF   I3 (.D(net3), .Q(net6), .T(CLK), .R(RESET));
  FF   I4 (.D(net5), .Q(OUT), .T(CLK), .R(RESET));
  INV  I5 (.Y(net1), .A(net2));
  INV  I6 (.Y(net3), .A(net4));
  INV  I7 (.Y(net5), .A(net6));
endmodule
```

F I G. 7
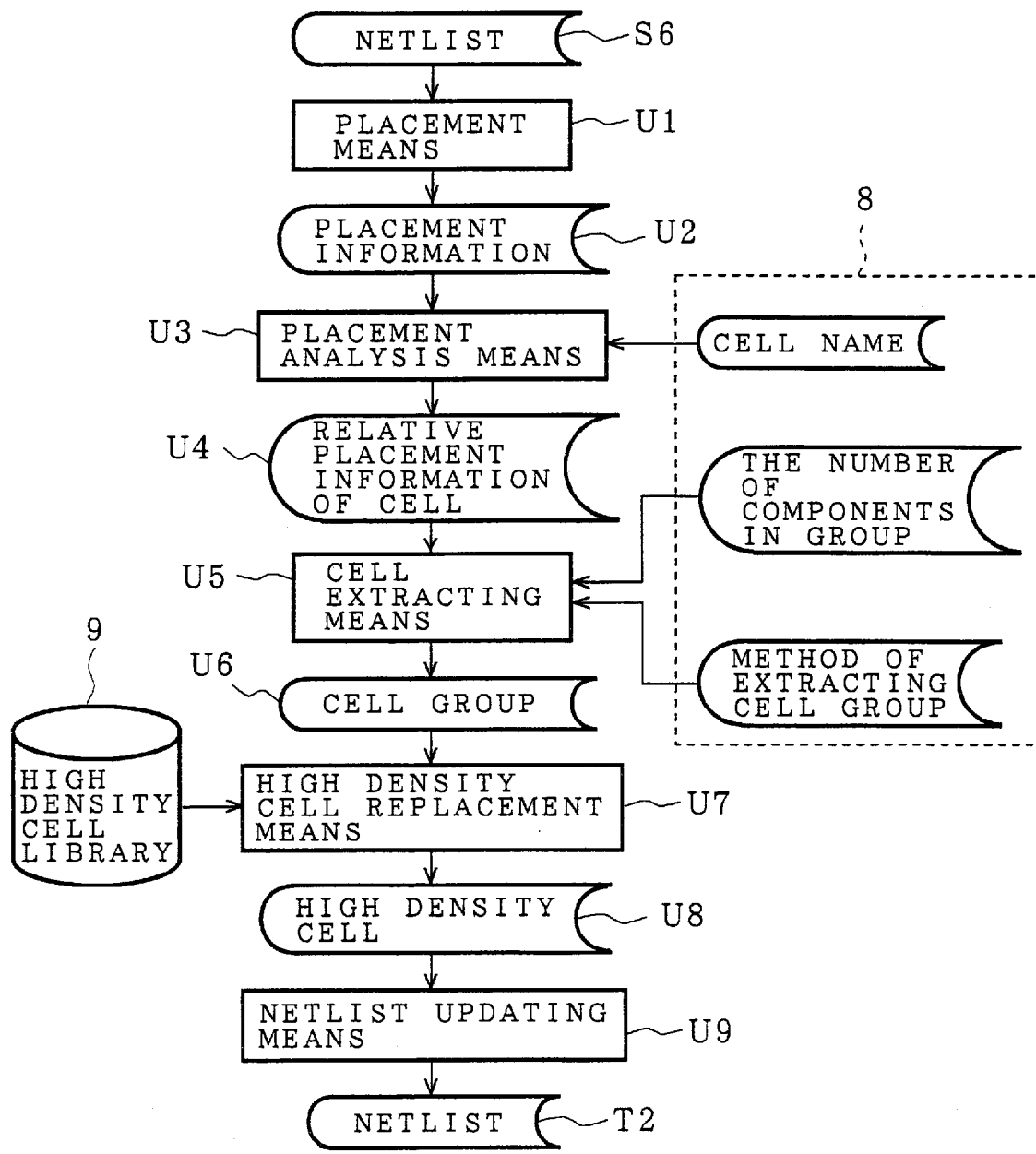

$d1, d2, d3 \leq D1$

FIG. 9

```
module CIRCUIT (DATA, CLK, RESET, Q)
  output    Q,
  input     DATA, CLK, RESET;

HyperFF I1  (.D1(DATA), .D2(net1), .D3(net3), .D4(net5),
               .Q1(net2), .Q2(net4), .Q3(net6), .Q4(OUT)
               .T(CLK), R1(RESET), .R2(RESET), .R3(RESET), .R4(RESET));

INV    I5   (.Y(net1), .A(net2));
  INV    I6   (.Y(net3), .A(net4));
  INV    I7   (.Y(net5), .A(net6));

endmodule
```

SEMICONDUCTOR INTEGRATED CIRCUIT INCLUDING A HIGH DENSITY CELL

BACKGROUND OF THE INVENTION

1. Field of the Invention

The present invention relates to a semiconductor integrated circuit device including a high density cell in which a more densely integrated layout is provided by a combination of a plurality of cells having the same circuit configuration, and to a method of fabrication of the semiconductor integrated circuit device.

2. Description of the Prior Art

FIG. 13 is a schematic diagram showing a conventional semiconductor integrated circuit device. In the drawing, reference numeral 10 denotes a cell bench. Various types of cells 11 are placed in an array on the cell bench 10. Wiring areas 12 are used for wiring among the cells. 13 is a macro cell, 14 is a ROM, and 15 is an input-output pad. Here, each cell 11 is a variety of types of cells which are placed in the array on the cell bench 10 with constant a cell height, and the macro cell 13 and the ROM 14 are building block type cells in which no constraint is imposed on cell shape.

As described above, in the semiconductor integrated circuit device, each cells 11, such as a flip-flop (FF), and a inverter (INV) is placed in the array on the cell bench 10.

A description will now be given of a method of fabrication of the conventional semiconductor integrated circuit device.

FIG. 14 is a flowchart showing the method of fabrication of the conventional semiconductor integrated circuit device. The semiconductor integrated circuit device is of a cell base type or a gate array type. Here, a description will be given of a method of fabrication of a cell base type of semiconductor integrated circuit device.

In Step S1, a product specification of an LSI (the cell base type of semiconductor integrated circuit device) to be developed is determined. In Step S2, a functional design is carried out depending upon the determined LSI specification to divide the specification into a macro level including, for example, a decoder, a memory, and a register as the minimum unit. Subsequently, in Step S3, a component in the divided macro level is expanded to a basic gate level such as AND, OR, INV, and so forth. A logic circuit diagram is created by using a cell corresponding to the type of gate. In Step S4, the logic circuit diagram created as described above is stored in a circuit diagram data file.

In Step S5, a net in the created logic circuit diagram is described by a gate level design description language to generate a netlist in a form in which a hierarchy is expanded to a cell level. Even when the logic circuit diagram has a hierarchical structure, the netlist is generated in a form in which the hierarchy is expanded to the cell level. The generated netlist is stored in a netlist file in Step S6.

In Step S7, the cells constituting the LSI are placed by placement means on the basis of the netlist. In Step S8, placement information of the cells, that is, a result of the placement such as names of the cells and absolute coordinates thereof is stored in a placement information file. Further, wiring among the cells is carried out by wiring means on the basis of the netlist in Step S9, and a layout diagram showing results of the placement and the wiring is stored in a layout result file in Step S10.

In Step S11, on the basis of the layout result, mask pattern generating means generates a mask pattern serving as an original production master of a photomask used in the exposure process of LSI fabrication. In Step S12, the generated mask pattern of the LSI is stored in a mask pattern storage file. A photomask used in the exposure process of the LSI fabrication is created on the basis of the mask pattern generated as described above in Step S13, and a series of LSI fabrication processes is carried out by using the created photomask in Step S14.

However, in the above method of fabrication of the semiconductor integrated circuit device, it is difficult to use a high density cell obtained by combining a plurality of cells having the same circuit configuration at a stage of logical design of the circuit. Thus, it is impossible to provide a semiconductor integrated circuit device including a high density cell.

The conventional semiconductor integrated circuit device has the above structure and the method of fabrication thereof has the above steps. As a result, there are problems in that, for example, a plurality of cells having the same circuit configuration can not be replaced with a high density cell having a circuit configuration equivalent thereto, and it is difficult to provide a semiconductor integrated circuit device including the high density cell.

SUMMARY OF THE INVENTION

In order to overcome the above problems, it is an object of the present invention to provide a semiconductor integrated circuit device in which a high density cell is effectively used to provide a higher integrated layout.

It is another object of the present invention to provide a method of fabrication of a semiconductor integrated circuit device in which a high density cell is effectively used to provide a higher integrated layout.

A semiconductor integrated circuit device according to the first aspect of the present invention includes at least one high density cell in which a higher integrated layout can be provided by combining a plurality of cells having the same circuit configuration, and by sharing a sharable basic gate portion among the plurality of cells.

In a semiconductor integrated circuit device according to the second aspect of the present invention, a high density cell includes one sharable basic gate portion, and a plurality of main portions of the cells.

A semiconductor integrated circuit device according to the third aspect of the present invention includes a plurality of high density cells, and all the plurality of high density cells include the same number of cells.

A semiconductor integrated circuit device according to the fourth aspect of the present invention includes at least two types of high density cells, and the high density cells of various types include different numbers of cells.

In a semiconductor integrated circuit device according to the fifth aspect of the present invention, a high density cell is provided by combining a plurality of flip-flop cells, and a clock waveform shaping buffer and an input buffer in the flip-flop cell are shared.

A method of fabrication of a semiconductor integrated circuit device according to the sixth aspect of the present invention includes the steps of grouping and extracting a plurality of cells having the same circuit configuration on the basis of a netlist in which a net of circuits is described, and replacing a group of extracted cells with a high density cell having the same function as that of the group of cells.

In a method of fabrication of a semiconductor integrated circuit device according to the seventh aspect of the present invention, a high density cell is provided by combining a plurality of cells having the same circuit configuration, and sharing a sharable basic gate portion among the plurality of cells.

A method of fabrication of a semiconductor integrated circuit device according to the eighth aspect of the present invention includes the steps of making initial placement of cells constituting a circuit on the basis of a netlist, and grouping and extracting a plurality of cells adjacently placed to have the same circuit configuration on the basis of the placement information of the cells.

A method of fabrication of a semiconductor integrated circuit device according to the ninth aspect of the present invention includes the steps of making initial placement of cells constituting a circuit on the basis of a netlist, and grouping and extracting a plurality of cells having the same circuit configuration, spaced apart from each other with a placement-to-placement distance therebetween equal to or less than a predetermined distance on the basis of the placement information of the cells.

A method of fabrication of a semiconductor integrated circuit device according to the tenth aspect of the present invention includes the steps of making initial placement of cells constituting a circuit on the basis of a netlist, and grouping and extracting a plurality of cells having the same circuit configuration, placed in placement stages with the number of stages within a predetermined number on the basis of the placement information of the cells.

A method of fabrication of a semiconductor integrated circuit device according to the eleventh aspect of the present invention includes the step of grouping and extracting a plurality of cells having the same circuit configuration for each input signal.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

BRIEF DESCRIPTION OF THE DRAWINGS

FIG. 6 is a diagram showing a netlist in which a net of the circuit shown in FIG. 5 is described;

FIG. 7 is a flowchart illustrating a method of replacement with a high density cell through high density cell replacement means;

FIG. 9 is a diagram showing a netlist in which replacement is made with the high density cell, and the net is updated;

DETAILED DESCRIPTION OF THE PREFERRED EMBODIMENTS

Preferred embodiments of the invention will now be described in detail referring to the accompanying drawings.

Embodiment 1

Figure 1:
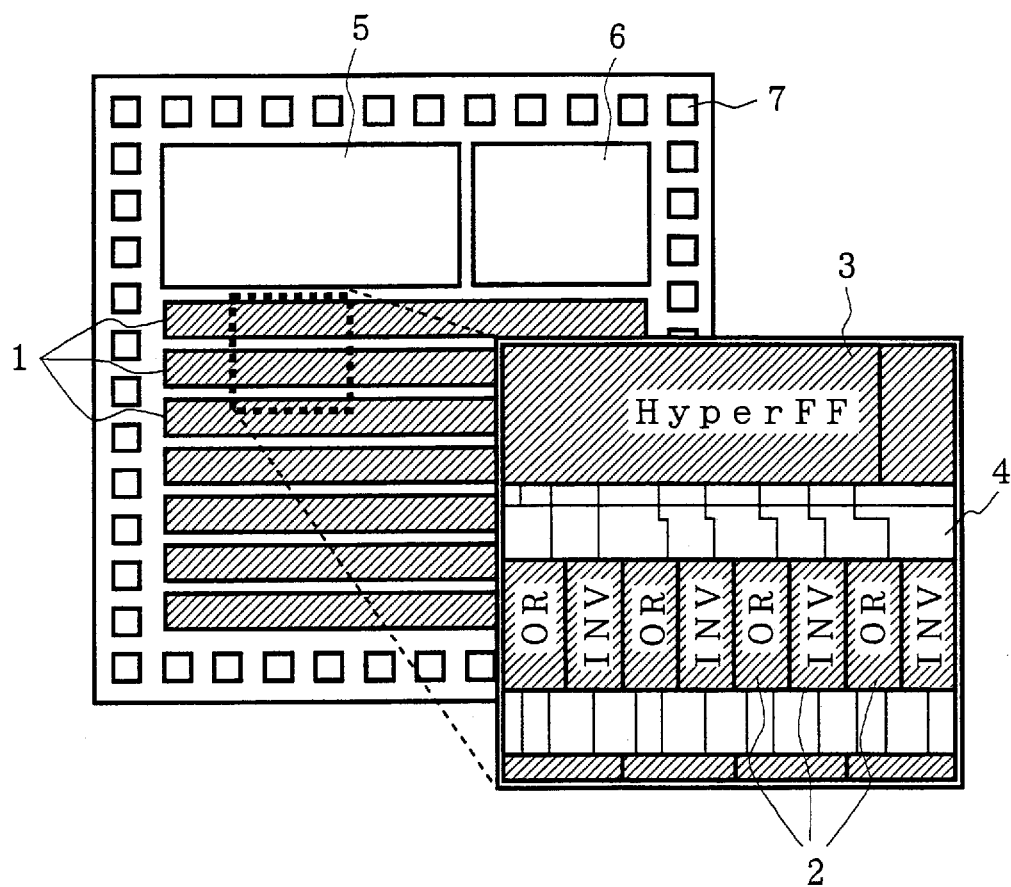
FIG. 1 is a schematic diagram showing a semiconductor integrated circuit device according to the embodiment 1 of the present invention.

FIG. 1 is a schematic diagram showing a semiconductor integrated circuit device according to the embodiment 1 of the present invention. In the drawing, reference numeral 1 denotes cell benches. Various types of cells 2 are placed in an array on the cell benches 1, 3 is a high density cell placed on the cell benches 1, 4 is a wiring area used for wiring among the cells, 5 is a macro cell, 6 is a ROM, and 7 is an input-output pad. Here, the cells 2 and the high density cell 3 are various types of cells which are placed in the array on the cell benches 1 with a constant cell height, and the macro cell 5 and the ROM 6 are building block type of cells in which no constraint is imposed on cell shape.

In the terms such as "basic gate" and "cell" as used throughout the instant specification, "basic gate" means a basic logical unit constituting a digital logic circuit such as an AND, OR, and or INV gate, and "cell" is a basic unit in LSI design including a combination of the basic gates such as an FF. However, the basic gates such as AND, OR, and INV gates may be expressed as a cell having a simple structure.

In the high density cell 3, a plurality of cells having the same circuit configuration are combined, and a sharable basic gate portion is shared among the plurality of cells. Thus, the high density cell 3 has the same function as that of the plurality of cells, and a higher integrated layout can be provided. In this case, the high density cell 3 shown in FIG. 1 is a high density flip-flop cell (HyperFF) in which four flip-flop cells (FF) shown in FIG. 6 are combined, and their waveform shaping buffer and input buffer are shared, thereby providing an higher integrated layout.

Figure 2:
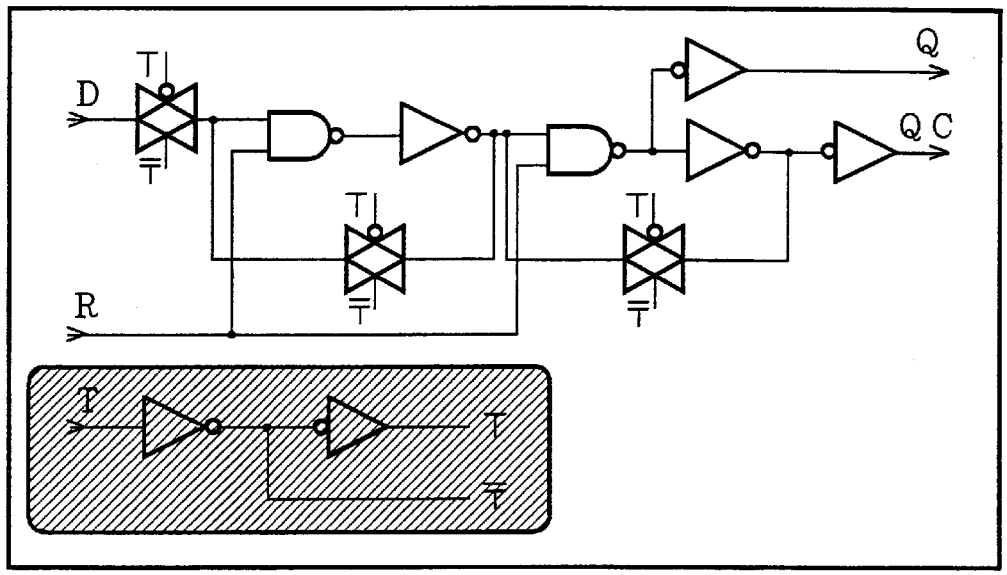
FIGS. 2(a),(b), and 2(c) are explanatory views showing one illustrative high density cell.
Figure 2:
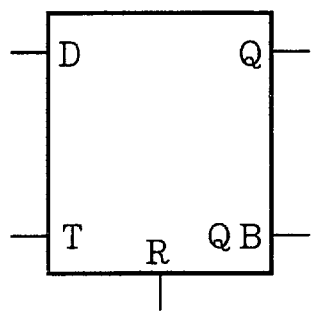
Figure 2:
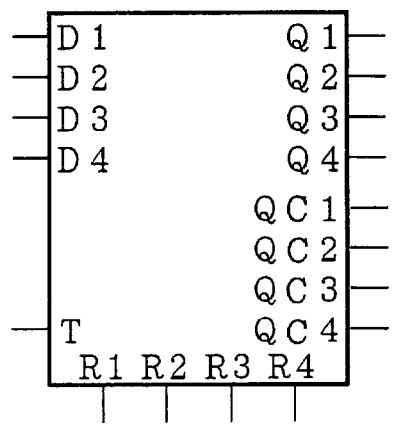

FIGS. 2(a)–2(c) are explanatory views showing one illustrative high density cell. FIG. 2(a) is a circuit diagram in which a flip-flop cell is described by using the basic gates, FIG. 2(b) shows a logic symbol of the flip-flop cell, and FIG. 2(c) shows the high density flip-flop cell having a circuit configuration equivalent to four flip-flop cells. Further, the shaded portion in the drawing denotes a basic gate portion which can be shared among the cells to provide the high density cell. That is, the flip-flop cell includes a main portion of a flip-flop circuit, and the sharable basic gate portion.

As set forth above, the high density cell shares the clock waveform shaping buffer and the input buffer in the flip-flop circuit.

Figure 3:
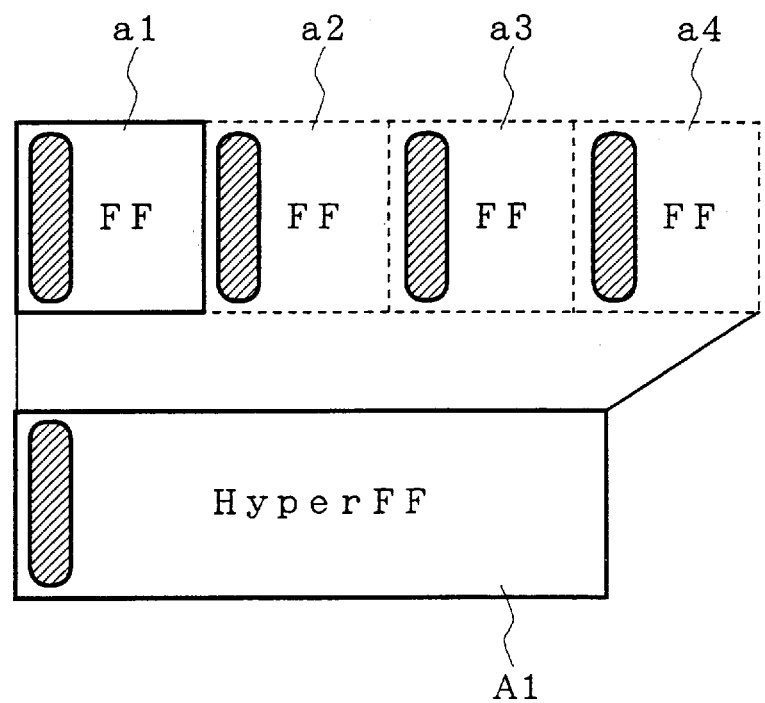
FIG. 3 is an explanatory view illustrating placement areas for flip-flop cells and a high density flip-flop cell

Referring now to FIG. 3, a description will now be given of placement areas for the flip-flop cells (FF) and the high density flip-flop cell (HyperFF) in FIG. 2(a).

In the drawing, reference numerals a1 to a4 denote flip-flop cells, and A1 is a high density flip-flop cell having a circuit configuration equivalent to that of the flip-flop cells a1 to a4. In the drawing, the shaded portion denotes a sharable basic gate portion, that is, the clock waveform shaping buffer and the input buffer in the flip-flop circuit. Thus, it can be seen that the high density flip-flop cell A1 can have a higher integrated layout than in case of the four sequentially arranged flip-flop cells a1 to a4 by an area reduced by sharing the sharable basic gate portions.

For the sake of simplicity, the above discussion illustrates a semiconductor integrated circuit device having a combination of the four flip-flop cells (FF), and the single high density flip-flop cell (HyperFF) with their waveform shaping buffer and input buffer shared. However, it must be noted that the semiconductor integrated circuit device of the present invention may have a plurality of the same high density flip-flop cells (HyperFF), or may concurrently include different high density flip-flop cells with different numbers of flip-flop cells combined. In addition, the high density cell in the semiconductor integrated circuit device of the present invention may be applied to a cell other than a flip-flop as long as the cell has a sharable basic gate portion.

A description will now be given of a method of fabrication of the semiconductor integrated circuit device according to embodiment 1 of the present invention.

Figure 4:
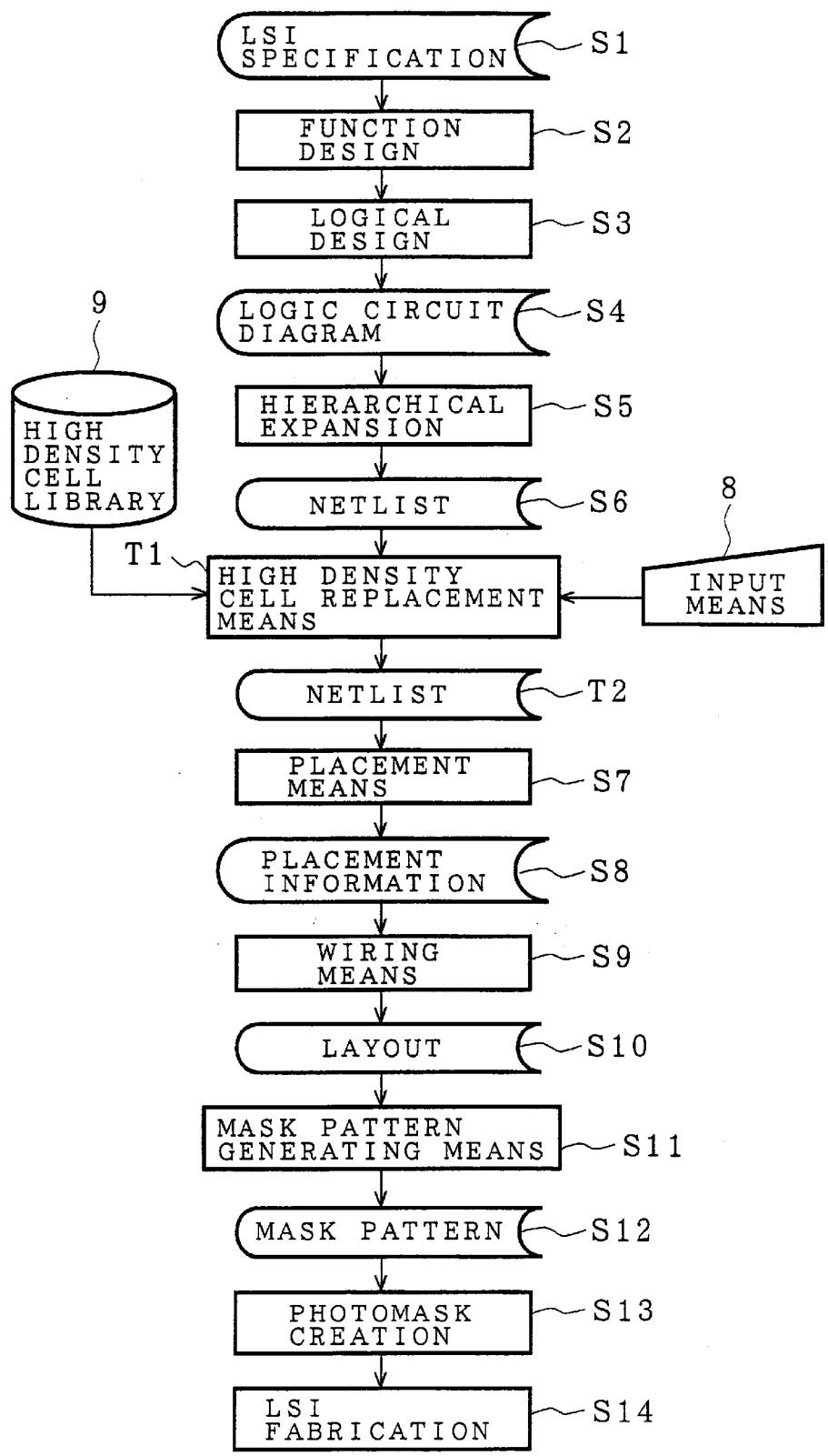
FIG. 4 is a general flowchart showing a method of fabrication of the semiconductor integrated circuit device according to embodiment 1 of the present invention.

FIG. 4 is a flowchart showing the method of fabrication of the semiconductor integrated circuit device according to embodiment 1 of the present invention. The semiconductor integrated circuit device is of a cell base type or a gate array type. Here, a description will be given of a method of fabrication of a cell base type of semiconductor integrated circuit device.

In Step S1, a product specification of an LSI (the cell base type of semiconductor integrated circuit device) to be developed is determined. In Step S2, a functional design is carried out on the basis of the determined LSI specification to divide the specification into a macro level including, for example, a decoder, a memory, and a register as the minimum unit. Subsequently, in Step S3, a component in the divided macro level is expanded to a basic gate level including AND, OR, INV, and so forth. At the time, a logic circuit diagram is created by using a cell corresponding to the type of gate. In Step S4, the logic circuit diagram created as described above is stored in a circuit diagram data file.

In Step S5, a net in the created logic circuit diagram is described by a gate level design description language to generate a netlist in a form in which a hierarchy is expanded to a cell level. Even when the logic circuit diagram has a hierarchical structure, the netlist is generated in a form in which the hierarchy is expanded to the cell level. The generated netlist is stored in a netlist storage file in Step S6.

Figure 5:
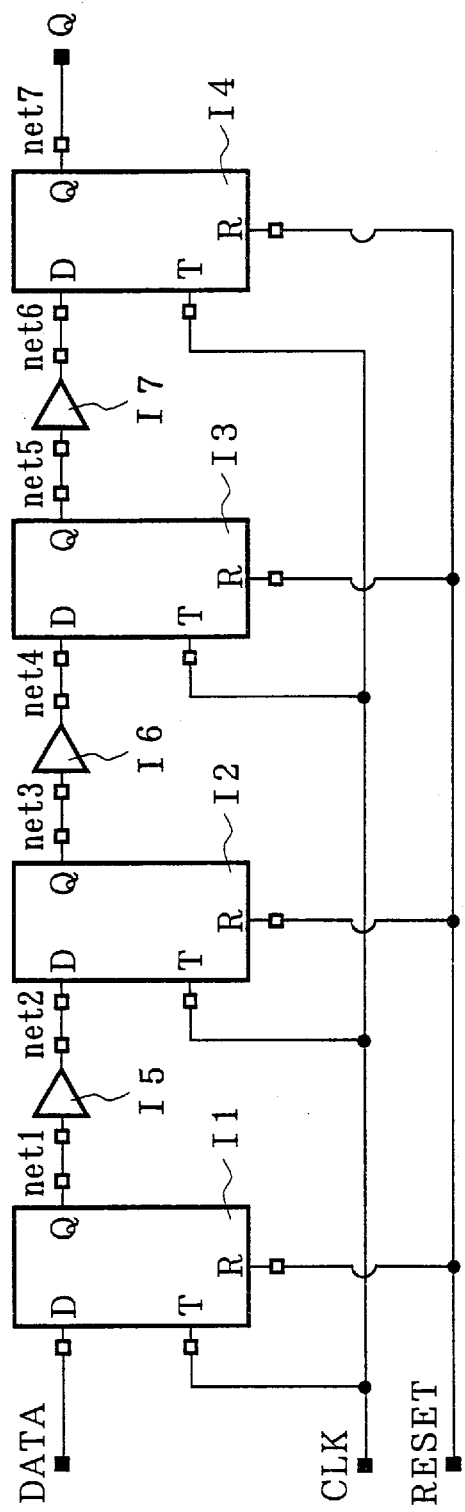
FIG. 5 is a circuit diagram showing one illustrative logic circuit using flip-flop cells and inverter cells.

FIG. 5 shows one illustrative logic circuit using flip-flop cells and inverter cells. In the drawing, reference numerals I1 to I4 denote flip-flop cells, and I5 to I7 are inverter cells.

Further, FIG. 6 shows a netlist in which the net of the circuit shown in FIG. 5 is described. In the drawing, net information of one circuit called CIRCUIT is described in the range from "module" to "endmodule", "input" and "output" define a name of an input-output pin of the circuit, and "FF" and "INV" are cell names used in the circuit. Further, reference numerals I1 to I7 denote mnemonic-names of the cells used in the circuit, and data showing a net of the cells is described in a portion surrounded by parentheses in a column next to a column including the mnemonic-names. "Netlist" as used herein means design data showing a net in the LSI logic circuit. In the netlist, the net is hierarchically described to make data description compact. In the netlist shown in FIG. 6, the logic net information of the circuit shown in FIG. 5 is described by using Verilog-HDL which is an industry-standard design description language.

Subsequently, in Step T1, according to a method of replacement with the high density cell specified by a designer through input means 8, high density cell replacement means extracts a plurality of cells having the same circuit configuration from such a netlist, and groups the extracted cells to replace the cells with a high density cell previously stored in a high density cell library 9. In addition, the high density cell replacement means performs net updates associated with the replacement with the high density cell thereby to update the netlist. The netlist updated as described above is stored in a netlist storage file in Step T2.

A detailed description will now be given of a method of replacement with the high density cell through the high density cell replacement means.

FIG. 7 is a flowchart illustrating the method of replacement with the high density cell through the high density cell replacement means.

First of all, according to the method of replacement with the high density cell, the designer specifies a name of a cell to be grouped, the number of component cells to be grouped, and a method of extracting a cell group. The method of extracting the cell group will be described infra.

Next, in Step U1, placement means makes initial placement of the cells constituting the LSI on the basis of the netlist of Step S6 described above. In Step U2, obtained placement information, that is, a result of placement such as names of the cells and absolute coordinates thereof (coordinates of the bottom left endpoint and the top right endpoint of the cell) is stored in a placement information file. Further, in Step U3, depending upon the name of the cell to be grouped, inputted by the designer, relative placement information of the corresponding cell is extracted by placement analysis means. The relative placement information of the cell can be calculated on the basis of the placement information of the cells the time of initial placement, that is, the absolute coordinates of the cells. The relative placement information obtained according to the above method is stored in a relative placement information file in Step U4.

Subsequently, in Step U5, cell extracting means extracts a cell group from the relative placement information of the cell depending upon the number of component cells to be grouped and the method of extracting the cell group which are specified by the designer.

Figure 8A:
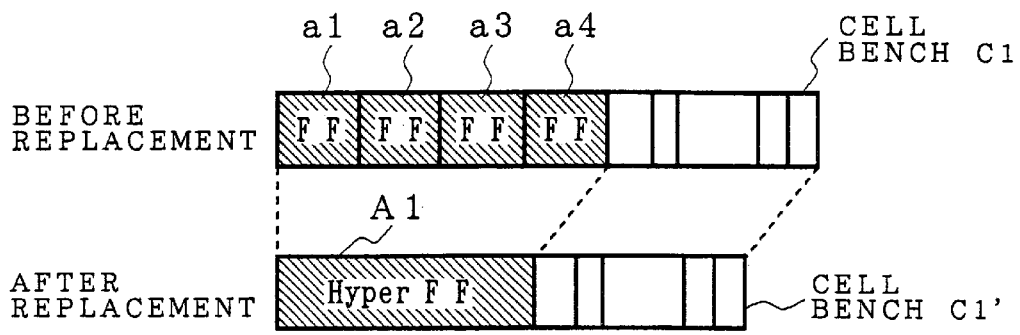
FIGS. 8(a)–8(c) are explanatory views showing a method of extracting a cell group.
Figure 8B:
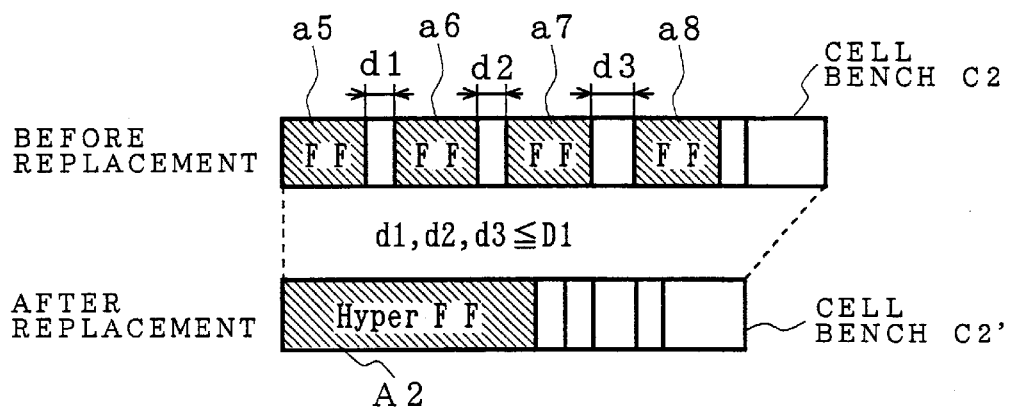
Figure 8C:
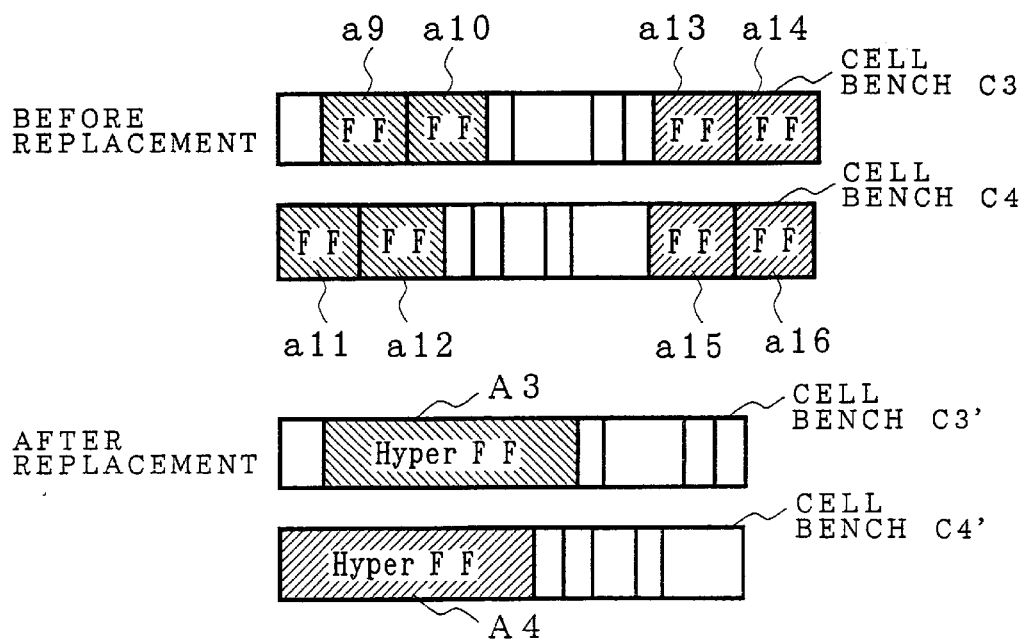

In this case, the designer may select the method of extracting the cell group from among the following three methods:

FIGS. 8(a)–8(c) are explanatory views showing the method of extracting the cell group. For the sake of simplicity, a description will be given of a case where the designer specifies Flip-flop as the name of cell, and four as the number of component cells in a group, that is, a case where the designer specifies to group and extract the four flip-flop cells.

FIG. 8(a) is an explanatory view showing a method (1) of extracting a cell group. In the drawing, reference numeral C1 denotes a cell bench before replacement, a1 to a4 are four flip-flop cells adjacently placed on the cell bench C1, C1' is a cell bench after replacement with the high density cell, and A1 is a high density flip-flop cell (HyperFF) obtained by replacement after grouping the flip-flop cells a1 to a4 adjacently placed. As stated above, in the extraction method (1), the four flip-flop cells a1 to a4 adjacently placed on the same cell bench C1 are grouped and extracted.

That is, in the extraction method (1), on the basis of the relative placement information of the cell extracted in Step U3, the cell extracting means groups and extracts the cells adjacently placed and having the same circuit configuration according to the number of component cells in the group, specified by the designer.

FIG. 8(b) is an explanatory view showing a method (2) of extracting a cell group. In the drawing, reference numeral D1 denotes a placement-to-placement distance between cells specified by the designer, C2 is a cell bench before replacement, a5 to a8 are four flip-flop cells spaced from each other and placed on the cell bench C2, d1 is a placement-to-placement distance between flip-flop cells a5 and a6, d2 is a placement-to-placement distance between flip-flop cells a6 and a7, d3 is a placement-to-placement distance between flip-flop cells a7 and a8, C2' is a cell bench after replacement with a high density cell, and A2 is a high density flip-flop cell obtained by replacement after grouping the flip-flop cells a5 to a8. It is to be noted that the placement-to-placement distances d1 to d3 between the cells are respectively shorter than the placement-to-placement distance D1 specified by the designer. As set forth above, the extraction method (2) is performed to group and extract the four flip-flop cells a5 to a8 spaced apart from each other and placed on the same cell bench C2 such that the placement-to-placement distances between the cells are respectively equal to or less than the distance D1.

That is, in the extraction method (2), on the basis of the relative placement information of the cell extracted in the Step U3, the cell extracting means groups and extracts the cells having the same circuit configuration, spaced apart from each other and placed such that the placement-to-placement distances between the cells are respectively equal to or less than the distance D1 specified by the designer according to the number of component cells in the group, specified by the designer.

In the extraction method (2), the adjacent cells a1 to a4 in FIG. 8(a) are regarded as cells with the placement-to-placement distance of zero. It is thereby possible to combine the extraction method (2) with the extraction method (1), and more efficiently extract the cell group. Further, though the designer can optionally specify the placement-to-placement distance D1, it is desirable in view of, for example, more efficient wiring to set the placement-to-placement distance D1 in consideration of a characteristic (including cell width, and the number of input-output signals) of the cell to be replaced with the high density cell, chip size of the semiconductor integrated circuit device to be designed, and so forth.

FIG. 8(c) is an explanatory view showing a method (3) of extracting a cell group. In the drawing, reference numerals C3 and C4 denote cell benches before replacement, a9 to a12 and a13 to a16 are respectively four flip-flop cells placed in placement stages with the number of stages within the number specified by the designer (in two stages in this case), C3' and C4' are cell benches after the replacement with the high density cell, A3 is a high density flip-flop cell obtained by replacement after grouping the flip-flop cells a9 to a12 placed in the placement stages with the number of stages within the number specified by the designer, and A4 is a high density flip-flop cell obtained by replacement after grouping the flip-flop cells a13 to a16 placed in the placement stages with the number of stages within the number specified by the designer. As stated above, in the extraction method (3), the four flip-flop cells a9 to a12 and a13 to a16 are grouped and extracted from among the flip-flop cells placed in the placement stages with the number of stages within the number specified by the designer.

That is, in the extraction method (3), on the basis of the relative placement information of the cell extracted in the Step U3, the cell extracting means groups and extracts the cells having the same circuit configuration placed in the placement stages with the number of stages within the number specified by the designer according to the number of component cells in the group, specified by the designer.

Further, it is possible to combine the extraction method (3) with the above extraction method (2) so as to more efficiently extract the cell group.

Hence, in Step U5, the cell extracting means extracts the cell group depending upon the cell group extraction method specified by the designer from among the extraction methods (1) to (3), and the number of component cells in the cell group. In Step U6, information of the extracted cell group is stored in a group information file.

Next, in Step U7, the high density cell replacement means selects a high density cell having a circuit configuration equivalent to that of the extracted cell group from the high density cell library 9 in which information about the high density cell is stored in advance. Then, the extracted cell group is replaced with the selected high density cell. Information about the high density cell used for the replacement is stored in a high density cell information file in Step U8. In Step U9, netlist updating means updates wiring information associated with the replacement with the high density cell. In such a manner, the netlist, in which the replacement is made with the high density cell and the net is updated, is stored in the netlist storage file in Step T2.

FIG. 9 shows the netlist in which the replacement is made with the high density cell, and the net is updated. In the drawing, HyperFF is a cell name of a high density flip-flop cell used in the circuit. As in the case of FIG. 6, in the netlist shown in FIG. 9, logic net information is described by using Verilog-HDL, an industry-standard language, as a design description language.

Figure 10:
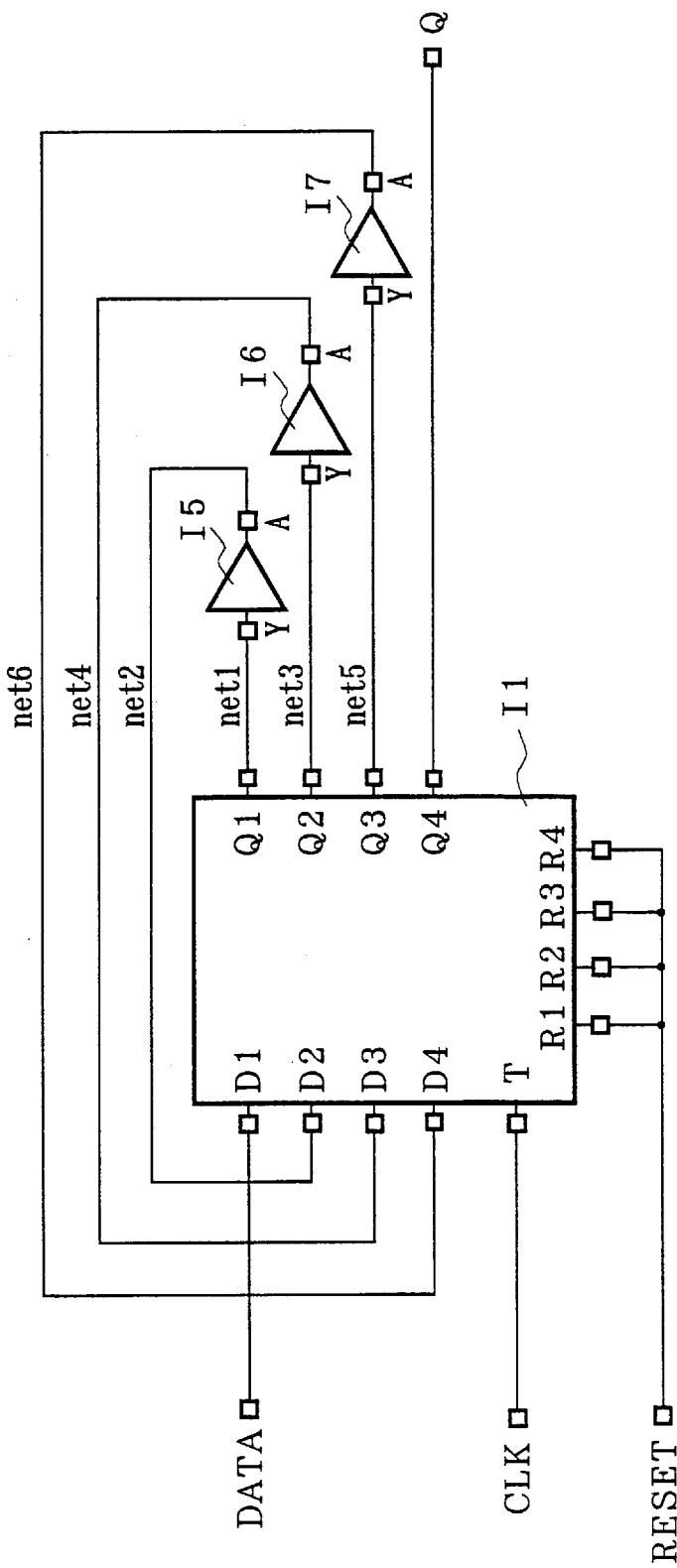
FIG. 10 is a circuit diagram of a circuit using a high density flip-flop cell and inverter cells corresponding to the netlist shown in FIG. 9.

Further, FIG. 10 shows a circuit using a high density flip-flop cell and inverter cells corresponding to the netlist shown in FIG. 9. In the drawing, reference numeral I1 denotes a high density flip-flop cell, and I5 to I7 are inverter cells. Thus, a circuit having a circuit configuration equivalent to that of the circuit shown in FIG. 5 includes the high density flip-flop cell I1 and the inverter cells I5 to I7.

Subsequently, in Step S7, the placement means places the cells once again on the basis of the netlist in which the replacement is made with the high density cell and the net is updated. In Step S8, placement information, that is, a result of placement such as names of the cells and absolute coordinates thereof, is stored in a placement information file. Further, in Step S9, wiring means performs wiring among the cells on the basis of the netlist in which the replacement is made with the high density cell and the net is updated. In Step S10, a layout diagram showing results of the placement and the wiring is stored in a layout result storage file.

In Step S11, on the basis of the layout result, mask pattern generating means generates a mask pattern serving as an original production master of a photomask used in an exposure process used in the LSI fabrication. In Step S12, the generated mask pattern of the LSI is stored in a mask pattern storage file. In Step S13, a photomask used in the exposure process of the LSI fabrication is created on the basis of the mask pattern generated as described above. Further, in Step S14, a series of LSI fabrication processes is carried out by using the created photomask.

In the semiconductor integrated circuit device fabricated as described above, integration and wiring efficiency can be enhanced since the high density cell having a higher integrated layout is effectively used.

As set forth above, the semiconductor integrated circuit device according to the embodiment 1 includes a high density cell in which the plurality of cells having the same circuit configuration are combined, and a sharable basic gate portion is shared among the plurality of cells. Consequently, it is possible to provide a semiconductor integrated circuit device having a more highly integrated layout, a reduction in chip size, and so forth.

Further, according to the method of fabrication of the semiconductor integrated circuit device according to embodiment 1, the semiconductor integrated circuit device can be fabricated by effectively using the high density cell.

Embodiment 2

In embodiment 2, another method of fabrication of a semiconductor integrated circuit device is proposed in which a replacement can be made with a high density cell in a shorter time than in embodiment 1. Descriptions of component parts identical with those in embodiment 1 are omitted.

Figure 11:
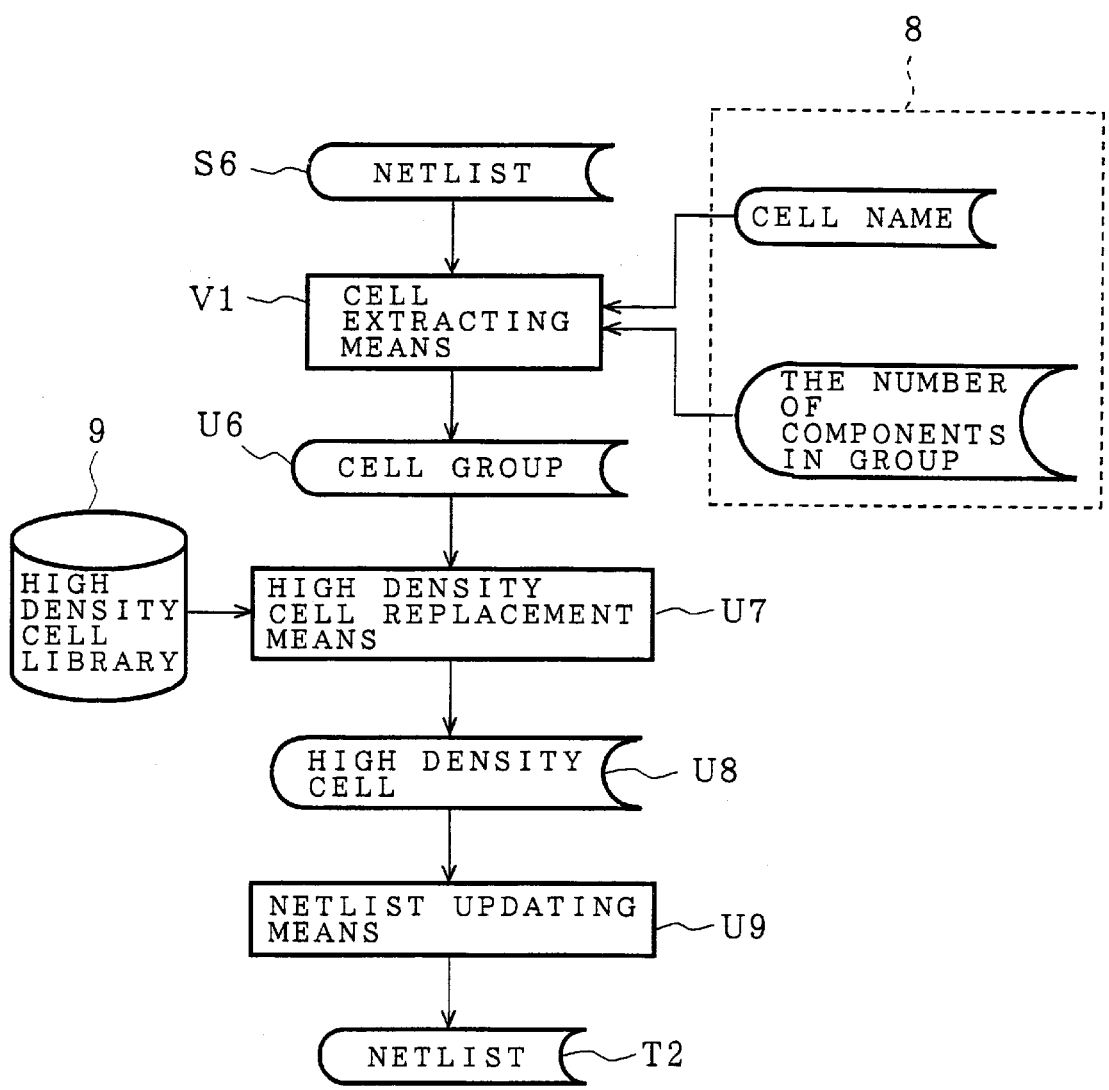
FIG. 11 is a flowchart illustrating a method of replacement with a high density cell through high density cell replacement means according to embodiment 2 of the present invention.

FIG. 11 is a flowchart illustrating a method of replacement with the high density cell through high density cell replacement means.

First of all, a designer uses input means 8 to specify a name of a cell to be grouped and the number of component cells to be grouped. Next, in Step V1, cell extracting means groups and extracts cells having the specified cell name by the specified number of component cells from the netlist in the Step S6 in the embodiment 1. In Step U6, information of the extracted cell group is stored in a group information file.

Subsequently, in Step U7, high density cell replacement means selects a high density cell having a circuit configuration equivalent to that of the extracted cell group from a high density cell library 9. Then, the extracted cell group is replaced with the selected high density cell. Information about the high density cell used for the replacement is stored in a high density cell information file in Step U8. In Step U9, netlist updating means updates wiring information associated with the replacement with the high density cell. In such a manner, the netlist, in which the replacement is made with the high density cell and the net as updated, is stored in a netlist storage file in Step T2.

Thus, as in the embodiment 1, the semiconductor integrated circuit device is fabricated on the basis of the netlist in which the replacement is made with the high density cell and the net is updated.

As set forth above, according to embodiment 2, the high density cell replacement means can directly extract the cell group from the netlist of a logic circuit diagram without initial placement of the cells. Hence, it is possible to provide another method of fabrication of the semiconductor integrated circuit device in which the replacement can be made with the high density cell in a shorter time in embodiment 1.

Embodiment 3

As shown in FIG. 2(c), in a high density cell employed in the present invention, a more highly integrated layout is provided by sharing an input gate portion of a cell such as clock driver almost without exception. Hence, in order to fabricate a semiconductor integrated circuit device having a plurality of clock signals, cell extracting means must extract a cell group for each input signal.

Therefore, in embodiment 3, another method of fabrication of a semiconductor integrated circuit device is provided in which a cell group can be extracted for each input signal. Descriptions of component parts identical with those in embodiment 1 or embodiment 2 are omitted.

Figure 12:
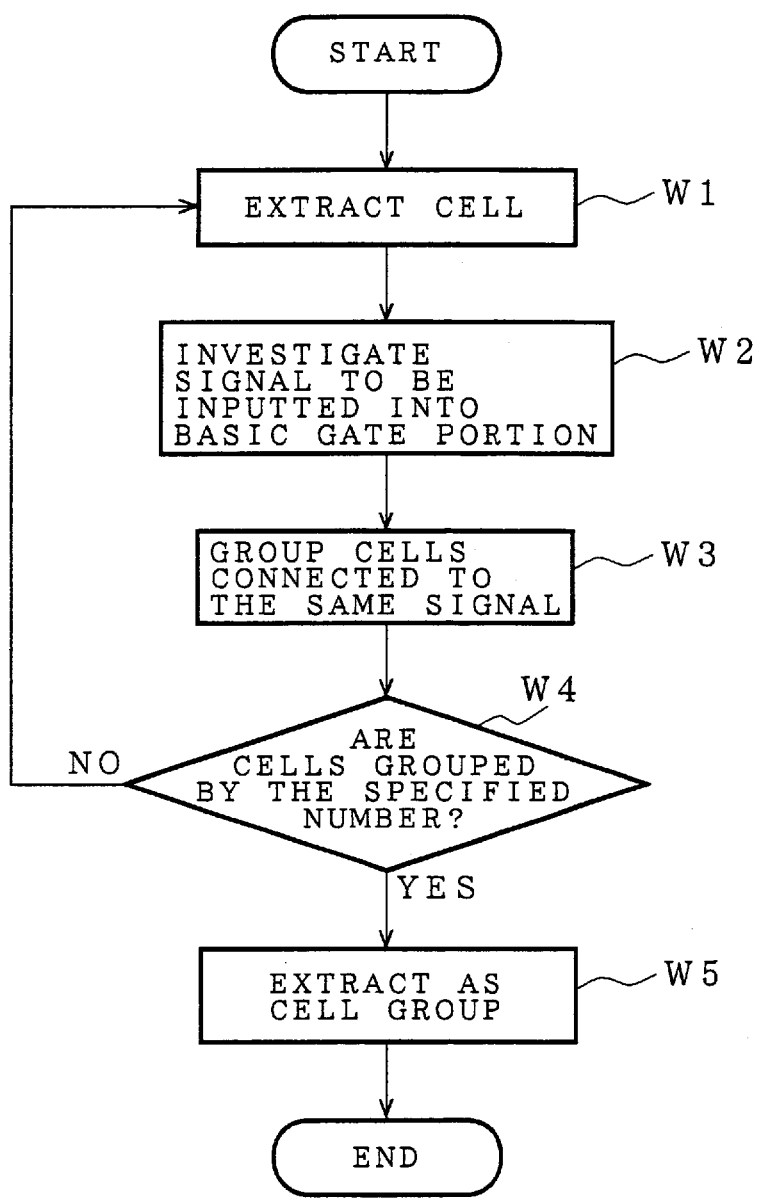
FIG. 12 is a flowchart of a process in which a cell group is extracted for each input signal according to embodiment 3 of the present invention.
Figure 13:
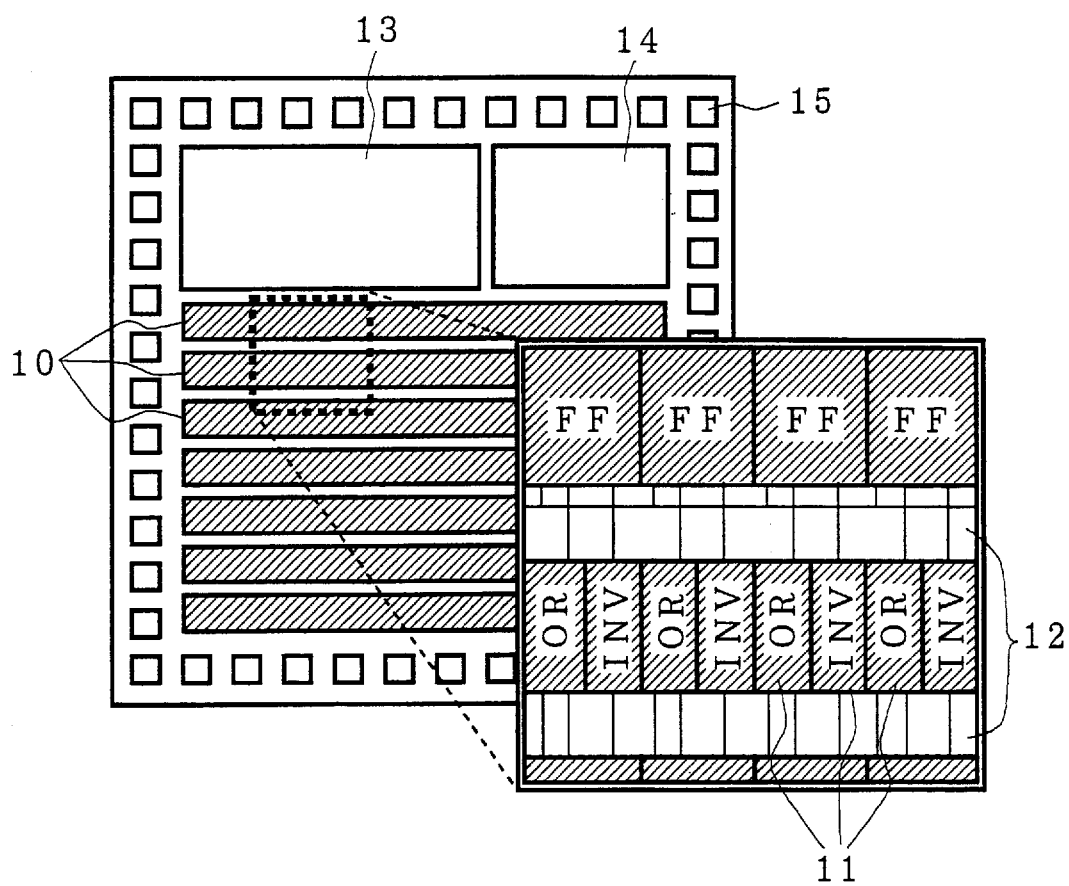
FIG. 13 is a schematic diagram showing a conventional semiconductor integrated circuit device.
Figure 14:
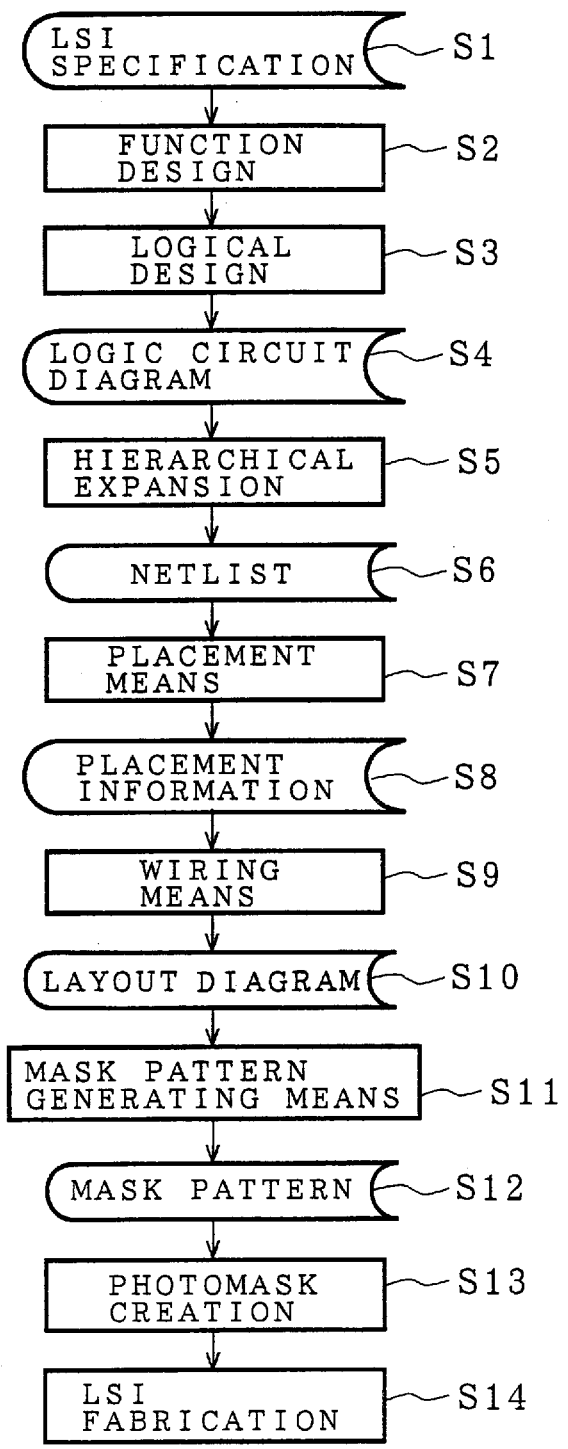
FIG. 14 is a flowchart showing a method of fabrication of the conventional semiconductor integrated circuit device.

FIG. 12 is a flowchart of process in which a cell group is extracted for each input signal.

In Step W1, on the basis of a name of a cell specified by a designer, one corresponding cell is extracted. In Step W2, a netlist is investigated for a signal to be input into a sharable basic gate portion in the extracted cell. Subsequently, in Step W3, the operation is carried out to group cells in which a signal input into the sharable basic gate portion is identical with the input signal investigated in Step W2. In Step W4, it is decided whether the cells are grouped by the specified number of component cells in the group.

Here, if the cells are grouped by the specified number of component cells in Step W4, the cells are extracted as a cell group in Step W5. On the other hand, if the cells are not grouped by the specified number of component cells in Step W4, the operation returns to Step W1 to repeat the process.

As set forth above, according to embodiment 3, it is possible to provide a method of fabrication of a semiconductor integrated circuit device in which a cell group can be extracted for each input signal.

As set forth above, according to the first aspect of the present invention, there is provided the semiconductor integrated circuit device including the at least one high density cell in which the higher integrated layout can be provided by combining the plurality of cells having the same circuit configuration, and sharing the sharable basic gate portion among the plurality of cells. As a result, it is possible to provide the semiconductor integrated circuit device in which the high density cell is effectively used to provide the higher integrated layout.

According to the second aspect of the present invention, there is provided the semiconductor integrated circuit device in which the high density cell includes one sharable basic gate portion and the plurality of main portions of the cells. As a result, it is possible to provide the semiconductor integrated circuit device in which the high density cell is effectively used to provide the higher integrated layout.

According to the third aspect of the present invention, there is provided the semiconductor integrated circuit device in which all the plurality of high density cells include the same number of cells. As a result, it is possible to provide the semiconductor integrated circuit device in which the high density cell is effectively used to provide the higher integrated layout.

According to the fourth aspect of the present invention, there is provided the semiconductor integrated circuit device including the at least two types of high density cells, and the high density cells of various types include different numbers of cells. As a result, it is possible to provide the semiconductor integrated circuit device in which the high density cell is effectively used to provide the higher integrated layout.

According to the fifth aspect of the present invention, there is provided the semiconductor integrated circuit device in which the high density cell is provided by combining the plurality of flip-flop cells, and the clock waveform shaping buffer and the input buffer in the flip-flop cell are shared. Thus, the higher integrated layout can be provided by the area reduced by the sharing of the clock waveform shaping buffer and the input buffer. As a result, it is possible to provide the semiconductor integrated circuit device in which the high density cell is effectively used to provide the higher integrated layout.

According to the sixth aspect of the present invention, there is provided the method of fabrication of the semiconductor integrated circuit device including the steps of grouping and extracting the plurality of cells having the same circuit configuration on the basis of the netlist in which the net of the circuit is described, and replacing the group of the extracted cells with the high density cell having the same function as that of the group of cells. As a result, it is possible to fabricate the semiconductor integrated circuit device in which the high density cell is effectively used to provide the higher integrated layout.

According to the seventh aspect of the present invention, there is provided the method of fabrication of the semiconductor integrated circuit device in which the high density cell is provided by combining the plurality of cells having the same circuit configuration, and by sharing the sharable basic gate portion among the plurality of cells. As a result, it is possible to provide the semiconductor integrated circuit device in which the high density cell is effectively used to provide the higher integrated layout.

According to the eighth aspect of the present invention, there is provided the method of fabrication of the semiconductor integrated circuit device including the steps of making the initial placement of the cells constituting the circuit on the basis of the netlist, and grouping and extracting the plurality of cells adjacently placed to have the same circuit configuration on the basis of the placement information of the cells. Thus, the grouping of the cells can efficiently be made on the basis of the result of initial placement. As a result, it is possible to fabricate the semiconductor integrated circuit device having the higher integrated layout.

According to the ninth aspect of the present invention, there is provided the method of fabrication of the semiconductor integrated circuit device including the steps of making the initial placement of the cells constituting the circuit on the basis of the netlist, and grouping and extracting the plurality of cells having the same circuit configuration, spaced apart from each other with the placement-to-placement distance therebetween equal to or less than the predetermined distance on the basis of the placement information of the cells. Thus, the grouping of the cells can efficiently be made on the basis of the result of initial placement. As a result, it is possible to fabricate the semiconductor integrated circuit device having the higher integrated layout.

According to the tenth aspect of the present invention, there is provided the method of fabrication of the semiconductor integrated circuit device including the steps of making the initial placement of the cells constituting the circuit on the basis of the netlist, and grouping and extracting the plurality of cells having the same circuit configuration, placed in the placement stages with the number of stages within the predetermined number on the basis of the placement information. Thus, the grouping of the cells can efficiently be made on the basis of the result of initial placement. As a result, it is possible to fabricate the semiconductor integrated circuit device having the higher integrated layout.

According to the eleventh aspect of the present invention, there is provided the method of fabrication of the semiconductor integrated circuit device including the step of grouping and extracting the plurality of cells having the same circuit configuration for each input signal. As a result, it is possible to provide the method of fabrication of the semiconductor integrated circuit device in which the cell group can be extracted for each input signal.

While preferred embodiments of the invention have been described using specific terms, such description is for illustrative purposes only, and it is to be understood that changes and variations may be made without departing from the spirit or scope of the following claims.

What is claimed is:

1. A semiconductor integrated circuit device comprising at least one high density cell including a single basic gate structure and a plurality of cells, each cell of the plurality of cells having an identical circuit configuration, and all of the plurality of cells sharing the basic gate structure, whereby the high density cell occupies less area than occupied by complete cells in the same number as the plurality of cells, each complete cell including a cell and an individual basic gate structure.

2. The semiconductor integrated circuit device according to claim 1, comprising a plurality of high density cells, wherein each of the plurality of high density cells includes an identical number of cells.

3. The semiconductor integrated circuit device according to claim 1, comprising at least two different high density cells, wherein the high density cells include different numbers of cells.

4. The semiconductor integrated circuit device according to claim 1, wherein the high density cell includes a plurality of flip-flop cells, a clock waveform shaping buffer, and an input buffer, the clock waveform shaping buffer and input buffer being shared by each of the flip-flop cells.

* * * * *